(12) United States Patent
Rinzler et al.

(10) Patent No.: US 7,776,444 B2
(45) Date of Patent: Aug. 17, 2010

(54) TRANSPARENT AND ELECTRICALLY CONDUCTIVE SINGLE WALL CARBON NANOTUBE FILMS

(75) Inventors: Andrew G. Rinzler, Newberry, FL (US); Zhihong Chen, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 11/583,545

(22) Filed: Oct. 19, 2006

(65) Prior Publication Data

US 2007/0141345 A1 Jun. 21, 2007

Related U.S. Application Data

(63) Continuation-in-part of application No. 10/622,818, filed on Jul. 18, 2003, now Pat. No. 7,261,852.

(60) Provisional application No. 60/417,729, filed on Oct. 10, 2002, provisional application No. 60/397,254, filed on Jul. 19, 2002.

(51) Int. Cl.
*B32B 9/00* (2006.01)

(52) U.S. Cl. ........................ 428/408; 977/742

(58) Field of Classification Search ................ 428/408; 977/742; 423/445 R, 447.2, 447.1; 264/29.1; 427/96

See application file for complete search history.

(56) References Cited

U.S. PATENT DOCUMENTS

| | | | |
|---|---|---|---|
| 5,238,674 A | 8/1993 | Vercoulen et al. | |
| 5,417,757 A | 5/1995 | Merienne et al. | |
| 5,456,943 A | 10/1995 | Guhl et al. | |
| 5,560,898 A | 10/1996 | Uchida et al. | |
| 5,853,877 A | 12/1998 | Shibuta | |
| 6,331,262 B1 * | 12/2001 | Haddon et al. | ............... 252/502 |
| 6,645,455 B2 | 11/2003 | Margrave et al. | |
| 6,936,233 B2 * | 8/2005 | Smalley et al. | ............ 423/447.1 |
| 7,060,241 B2 | 6/2006 | Glatkowski | |
| 7,261,852 B2 | 8/2007 | Rinzler et al. | |
| 2003/0122111 A1 * | 7/2003 | Glatkowski | .................. 252/500 |

OTHER PUBLICATIONS

Mickelson (Chemical Physics Letters 296 (1998) 188-194).*
Rinzler et al. "Large-scale purification of single-wall carbon nanotubes: process, product, and characterization", Appl. Phys. A., (1998), vol. 67, pp. 29-37.
Bethune et al. "Cobalt-catalysed growth of carbon nanotubes with single-atomic-layer walls", Letters to Nature, (1993), vol. 363, pp. 605-607.
Lijima "Helical microtubes of graphitic carbon", Letters to Nature, (1991), vol. 354, pp. 354-358.
Minami "Optical properties of semiconducting and metallic single wall carbon nanotubes: effects of doping and high pressure", Synthetic Metals, (2001), vol. 116, pp. 405-409.

(Continued)

*Primary Examiner*—David R Sample
*Assistant Examiner*—Daniel Miller
(74) *Attorney, Agent, or Firm*—Saliwanchik, Lloyd & Saliwanchik (57) ABSTRACT

An optically transparent and electrically conductive single walled carbon nanotube (SWNT) film comprises a plurality of interpenetrated single walled carbon nanotubes, wherein for a 100 nm film the film has sufficient interpenetration to provide a 25° C. sheet resistance of less than 200 ohm/sq. The film also provides at least 20% optical transmission throughout a wavelength range from 0.4 μm to 5 μm.

10 Claims, 3 Drawing Sheets

OTHER PUBLICATIONS

Du, F., et al., "Effect of nanotube alignment on percolation conductivity in carbon nanotube/polymer composites", *Physical Review B*, 2005, pp. 12140-1-4, vol. 72.

Nikolaev, P., et al., "Gas-phase catalytic growth of single-walled carbon nanotubes from carbon monoxide", *Chemical Physics Letters*, 1999, pp. 91-97, vol. 313.

Peltola, J., et al., "Carbon-Nanotube Transparent Electrodes for Flexible Displays", Information Displays, Feb. 2007, pp. 2-5.

Rai, P., et al., "Dispersions of Functionalized Single-Walled Carbon Nanotubes in Strong Acids: Solubility and Rheology", *Journal of Nanoscience and Nanotechnology*, 2007, pp. 3378-3385, vol. 7.

Wu, Z., et al., "Transparent, Conductive Carbon Nanotube Films", *Science*, Aug. 2004, pp. 1273-1276, vol. 305, with supplemental text.

Yuan, D., "Property Control of Single Walled Carbon Nanotubes and Their Devices". Dissertation, Duke University, Dec. 2008.

Barazzouk, S., et al., "Single-Wall Carbon Nanotube Films for Photocurrent Generation. A Prompt Response to Visible-Light Irradiation," *J. Phys. Chem. B*, 2004, 108, 17015-17018.

Du, C., et al., "Preparation and preliminary property study of carbon nanotubes films by electrophoretic deposition," *Materials Letters*, 2002, 57, 434-438.

Ferrer-Anglada, N., et al., "Synthesis and characterization of carbon nanotube-conducting polymer thin films," *Diamond and Related Materials*, 2004, 13, 256-260.

Ferrer-Anglada, N., et al., "Conducting transparent thin films based on Carbon Nanotubes-Conducting Polymers," *Electronic Properties of Synthetic Nanostructures*, Abstract.

Fischer, J.E., "Magnetically aligned single wall carbon nanotube films: Preferred orientation and anisotropic transport properties," *Journal of Applied Physics*, 2003, vol. 93, No. 4.

Guo, Y., et al., "Multi-layer LB films of single-wall carbon nanotubes," *Physica B*, 2002, 323, 235-236.

Huang, L., et al., "Self-organizing high-density single-walled carbon nanotube arrays from surfactant suspensions," *Nanotechnology*, 2004, 15, 1450-1454.

Jacquemin, R., et al., "Doping mechanism in single-wall carbon nanotubes studied by optical absorption," *Synthetic Metals*, 2000, 115, 283-287.

Kaempgen, M., et al., "Transparent CNT Composites," *Molecular Nanostructures*, Abstract.

Kataura, H., et al., "Optical Properties of Single-Wall Carbon Nanotubes," *Synthetic Metals*, 1999, 103, 2555-2558.

Ladislav, K., et al., "Electrochemical Tuning of Electronic Structure of Single-Walled Carbon Nanotbues: In-situ Raman and Vis-NIR Study," *J. Phys. Chem.* 2001, 105, 10764-10771.

Kazaoui, S., et al., "Electrochemical tuning of electronic states in single-wall carbon nanotubes studies by in situ absorption spectroscopy and ac resistance," *Applied Physics Letters*, 2001, vol. 78, No. 22, pp. 3433-3435.

Kim, Y., et al., "Homogenous and structurally controlled thin films of single-wall carbon nanotubes by the Langmuir-Blodgett technique," *Synthetic Metals*, 2003, 135-136, 747-748.

Liu, C., et al., "Electrochemical Characterization of Films of Single-Walled Carbon Nanotubes and Their Possible Application in Supercapacitors," *Electrochemical and Solid-State Letters*, 1999, 11, 577-578.

Meitl, M., et al., "Solution Casting and Transfer Printing Single-Walled Carbon Nanotube Films," *Nano Letters*, 2004, vol. 4, No. 9, pp. 1643-1647.

Novak, J.P., et al., "Macroelectronic applications of carbon nanotube networks," *Solid-State Electronics*, 2004, 48, 1753-1756.

Sreekumar, T.V., et al., "Single-Wall Carbon Nanotube Films," *Chemical Mater*, 2003, 15, 175-178.

Sigma Product Information Sheet for Triton X-100.

Feng, W., et al., "Water Soluble Multi-Walled Nanotube and its Film Characteristics", *Chin. Phys. Lett.*, 2003, vol. 20, No. 5, 753.

Wang, T., et al., "Light Scattering Study on SWNTs Solutions" *American Physical Society Meeting Session C1*—Poster Session 1, Abstract.

Ward, J.W., et al., "A nonvolatile nanoelectromechanical memory element utilizing a fabric of carbon nanotubes", *Non-Volatile Memory Technology Symposium*, 2004, pp. 34-38, Abstract.

Kim, Y., et al., "Langmuir-Blodgett films of single-wall carbon nanotubes: layer-by-layer deposition and in-plane orientation of tubes," *Japanese Journal of Applied Physics*, 2003, vol. 42, No. 12, pp. 7629-7634, Abstract.

Sakakibara, Y., et al., "Near-infrared saturable absorption of single-wall carbon nanotubes prepared by laser ablation method," *Japanese Journal of Applied Physics*, 2003, vol. 42, No. 5A, pp. L494-L496, Abstract.

* cited by examiner

Note transparency and optical clarity.

TRANSPARENT AND ELECTRICALLY CONDUCTIVE SINGLE WALL CARBON NANOTUBE FILMS

CROSS-REFERENCE TO RELATED APPLICATIONS

This application is a continuation-in-part of U.S. patent application Ser. No. 10/622,818 filed on Jul. 18, 2003, now U.S. Pat. No. 7,261,582, which claims the benefit of U.S. Provisional Application No. 60/417,729 filed Oct. 10, 2002, and U.S. Provisional Patent Application No. 60/397,254 filed Jul. 19, 2002, the entireties of which are incorporated herein by reference.

STATEMENT REGARDING FEDERALLY SPONSORED RESEARCH OR DEVELOPMENT

This invention was made with U.S. Government support under Grant No. DAAD19-00-1-0002 awarded by DARPA. The U.S. Government may have certain rights in the invention.

FIELD OF THE INVENTION

This invention relates to the field of carbon nanotubes, and more particularly, to uniform films of single-walled carbon nanotubes (SWNTs) which are electrically conductive and optically transparent.

BACKGROUND

Carbon has four known general structures including diamond, graphite, fullerene and carbon nanotubes. Crystalline structure refers to the lattice arrangement of atoms. Carbon nanotubes refer to tubular structures grown with a single wall or multi-wall, which can be thought of as a rolled up sheet formed of a plurality of hexagons, the sheet formed by combining each carbon atom thereof with three neighboring carbon atoms. The carbon nanotubes have a diameter on the order of a few angstroms to a few hundred nanometers. Carbon nanotubes can function as either an electrical conductor, similar to a metal, or a semiconductor, according to the orientation of the hexagonal carbon atom lattice relative to the tube axis and the diameter of the tubes.

Originally, carbon nanotubes were produced by an arc discharge between two graphite rods as reported in an article entitled "Helical Microtubules of Graphitic Carbon" (Nature, Vol. 354, Nov. 7, 1991, pp. 56-58) by Sumio Iijima. This technique produced mostly multiwall carbon nanotubes. A method of producing mostly single wall carbon nanotubes was subsequently discovered and reported D. S. Bethune and co-workers (Nature, Vol. 363, pp. 605 (1993)).

There exist numerous applications for optically transparent, electrically conducting films. Since, as produced, single wall carbon nanotubes are known to contain a substantial fraction of intrinsically metallic nanotubes (typically about ⅓), nanotube films could be useful in such applications, provided the films were optically transparent, possessed uniform optical density across their area and possessed good electrical conductivity throughout the film. Optical transparency requires the films to be made sufficiently thin. Uniform optical density across an optical aperture requires the nanotubes to be homogeneously distributed throughout the film. Finally, good electrical conductivity throughout the film requires sufficient nanotube-nanotube overlap throughout the film.

The principal problem in producing nanotube films which meet these requirements of thinness, homogeneity and good intertube contact is the lack of solubility of the nanotubes in any known evaporable solvent. Given such a solvent, the nanotubes could simply be dissolved in a dilute concentration and then cast or sprayed in a thin uniform layer on a surface, leaving behind the desired transparent nanotube layer once the solvent evaporates. Because no such solvent for the nanotubes is known, if a deposition is attempted with nanotubes dispersed (e.g. by ultrasonication) in a solvent such as ethanol, inhomogeneous clumps of nanotubes result over the area of the deposited region.

Nanotubes can be uniformly suspended in solutions with the aid of stabilizing agents, such as surfactants and polymers, or by chemical modification of the nanotube sidewalls. However, stabilizing agents interfere with the required electrical continuity of the nanotube film. Stabilizing agents are generally electrical insulators. Once the solvent is evaporated, both the nanotubes and the stabilizing agent remain, the stabilizing agents interfering with the intertube electrical contact. In the case of chemical modification of the nanotube sidewall, the electrical conductivity of the nanotubes themselves is degraded.

As a result, while thin and reasonably transparent films of nanotubes have been produced for certain scientific purposes, such as for recording optical transmission spectra, these films have not provided sufficient electrical conductivity necessary for applications requiring films which provide both high electrical conductivity and optical transparency, such as for optically transparent electrodes.

SUMMARY OF THE INVENTION

An optically transparent and electrically conductive single walled carbon nanotubes (SWNT) film comprises a plurality of interpenetrated single walled carbon nanotubes SWNTs, wherein for a 100 nm film the film has sufficient interpenetration to provide a 25° C. sheet resistance of less than 200 ohm/sq. The film also provides at least 20% optical transmission throughout a wavelength range from 0.4 μm to 5 μm. In a preferred embodiment, a morphology of the film comprises stacked planes, the SWNTs having random orientation in the planes. The optical transmission can be at least 30% from 0.4 μm to 5 μm.

The SWNT film can include at least one dopant. In this embodiment, for a 100 nm thick film the sheet resistance is generally <50 ohm/square. The dopant can selected from the group consisting of halogens and graphite intercalants, such as alkali metals. The film generally consists essentially of (>99% per weight) SWNTs.

BRIEF DESCRIPTION OF THE DRAWINGS

The patent or application file contains at least one drawing executed in color. Copies of this patent or patent application in publication with the color drawing(s) will be provided by the Office upon request and payment of the necessary fee. A fuller understanding of the present invention and the features and benefits thereof will be accomplished upon review of the following detailed description together with the accompanying drawings, in which.

DETAILED DESCRIPTION OF THE INVENTION

The invention provides single wall carbon nanotube (SWNT) films which simultaneously exhibit high electrically conductivity, optical transparency and uniform optical density across their area, and methods for producing these films. Films according to the invention transmit light in both the visible and infrared portion of the electromagnetic spectrum.

Bulk electrical conductivity in nanotube aggregates requires that some appreciable fraction of the nanotubes be electrically conducting and that this fraction have sufficient intimate electrical contact with each other to transport charge throughout the bulk. Electrical conductivity of the nanotubes themselves can come from two sources. A first source is from the metallic nanotubes in the sample, which comprise about ⅓ of the nanotubes in SWNT material obtained commercially. A second source can come from semiconducting nanotubes in the sample, provided the semiconducting nanotubes are doped with a suitable charge transfer species. For example, halogens such as bromine and iodine, or alkali metal atoms, as well as certain other atoms or molecules, can be used as charge transfer species. Bulk electrical conductivity of the film is maximized by a high degree of nanotube contact, as well as the nanotube surfaces being largely free of any residual stabilizing agent since stabilizing agents tend to be electrically insulating materials.

Films according to the present invention are generally essentially pure nanotube films, defined herein as films having at least 99% nanotubes by weight. However, the present invention includes nanotube composites, which can include a lower percentage of nanotubes, such as 80 or 90% by weight nanotubes, along with one or more generally electrically conductive materials.

The film thickness can be tailored to range from a few tens of nanometers to several micrometers. The films produced using the invention have a substantially uniform nanotube density across their area which results in optical clarity. Optical transparency is enhanced for thin films(e.g. ≦100 nm) as compared to thicker films (e.g. 3 μm). Film thicknesses in the upper range generally become opaque. Particularly for transmission into the IR, optical transparency is believed to be enhanced by a low nanotube carrier density.

A preferred method for forming electrically conductive and optical transparent SWNT films which exhibit uniform optical density across their area includes the step of dispersing a low concentration of SWNTs, such as 0.005 mg/ml, in a solution, such as an aqueous solution, containing a sufficient concentration of stabilizing agent to suspend the nanotubes. Commercially available single walled carbon nanotubes, such as from Carbon Nanotechnologies Incorporated, Houston, Tex. provide roughly ⅓ metallic nanotubes and ⅔ semiconducting nanotubes. Preferably, the nanotubes used are purified to remove the large catalyst particles which are utilized in their formation.

The stabilizing agent can comprise a variety of surfactants such as sodium dodecyl sulfate (SDS) and TRITON X-100™, or surface stabilizing polymers. TRITON X-100™ is manufactured by the Dow Chemical Corporation, MI (formerly the Union Carbide Corporation). TRITON X-100™ is octylphenol ethylene oxide condensate and is also referred to as OCTOXYNOL-9™. This material has a molecular weight of 625 amu.

In this preferred method, the SWNT solution is then applied to a porous material. The porous material preferably comprises a filter membrane material, such as polycarbonate or mixed cellulose ester. The filter membrane preferably provides the following features:

1) a diameter larger than the optical aperture desired,
2) a high volume of porosity with a plurality of sub-micron pores, and
3) a composition that permits removal of the membrane material without disruption of the thin SWNT film, such as through dissolution of the membrane material in a solvent or digestion of the membrane material in an acid.

The solution is then removed leaving the nanotube film deposited on the membrane surface. The resulting nanotube film is generally quite flexible. In one embodiment, the solution is vacuum filtered off, with the SWNT film formed on the filter membrane surface. Any remaining surface stabilizing agent (e.g. surfactant) can be subsequently washed away and the film can then be allowed to dry.

Good dispersion of the SWNTs in the original solution combined with filtration provides a high degree of interpenetration of the nanotubes in the resulting film. This results because the nanotubes tend to remain straighter, having a longer persistence length in the solution when well dispersed.

The first bundles to land on the flat filtration membrane surface are forced to lie essentially parallel to the surface. Because the film generally grows at a uniform rate (with nanotube bundles lying across those deposited before them), subsequently deposited bundles take on the same planar orientations. The result is a film morphology wherein the nanotubes have random in plane orientations, but lie in stacked planes, with two-dimensional anisotropy similar to a biaxial oriented polymer film.

As a result, in the resulting film the nanotubes preferentially tend to lie across one another when forced during the filtration process onto the membrane surface. This leads to films having improved electrical continuity and better mechanical integrity over other available methods for generating thin nanotube films. Moreover, the filtration results in films having a high degree of compositional, structural and thickness uniformity, which translates to a high degree of optical uniformity and clarity. The optical uniformity and clarity requires that variation in the film thickness averaged over regions that are half the wavelength of the visible radiation be small. Such variations are within 10% for the films according to the invention.

In most applications once the nanotube film is formed on the porous material, such as a filtration membrane, the film must be removed from the typically opaque porous material using a suitable method. For example, one of the following exemplary methods may be used:

1) Membrane dissolution can be used. For example, for mixed cellulose ester membranes (MCEM), the membrane can be soaked in acetone or methanol, which dissolves the membrane leaving the nanotube film floating in the solvent. To ensure minimal cellulose ester residue on the film surface, the film can be transferred to fresh solvent, before being laid on a second layer for drying. The surface tension of the drying solvent ensures intimate contact between the nanotube film and the selected layer once they are dry.

2) The nanotube side of the membrane can be pressed against a selected layer. To aid in obtaining intimate contact between the selected layer and the nanotube film, a small quantity of a solution that does not dissolve the membrane, such as purified water, can be placed between the selected layer and the nanotube film using surface tension to bring the two respective surfaces into intimate contact. The assembly including the membrane, the nanotube film and the selected layer can then be allowed to dry. The membrane can then be dissolved in a solvent in which it is soluble leaving the nanotube film disposed on the selected layer.

A separation step is not necessarily required. For example, if the porous material selected is optically transparent in the wavelength range of interest, a separation step will not generally be necessary.

A possible limitation of the above-described method is that the film area can only be as large as the vacuum filtration apparatus provides. This is generally not a major limitation since such an apparatus can be made arbitrarily large, or alternatively, the films can be formed using a continuous process as described below.

In an alternate embodiment, a continuous process is used. In one continuous process embodiment, the filtration membrane can roll off a spool on one side of a vacuum filtration frit and be wound up, with the nanotube film, on the other side of the frit. The filter frit can have a rectangular shape, the width of the membrane in its longer direction, but narrow in the direction of travel of the membrane. The filter funnel, with its lower opening matching the frit, containing the nanotube solution can sit over the frit, with a magnetorheological fluid to make the seal between the funnel and the membrane moving by underneath. Keeping the frit narrow can reduce the force due to suction on the membrane, allowing it to be more easily drawn through the device. The SWNT film thickness can be controlled by the SWNT concentration in suspension and the rate of travel of the membrane.

Thus, the invention provides methods for forming electrically conductive and optically clear SWNT films. There are other presently available transparent electrode film deposition techniques for making non-SWNT films which can cover large areas and are compatible with thin film processing technologies for making displays, solar cells and similar devices. However, these transparent electrode film deposition methods are technologically demanding as they require expensive high vacuum equipment. Accordingly, a significant advantage of the invention is that optically transparent and electrically conductive SWNT films can be formed without the need for expensive high vacuum equipment.

SWNT films formed using the invention exhibit high mechanical integrity, including a high degree of flexibility. One advantage of high mechanical integrity is that the SWNT films can be made freestanding, provided that the film has sufficient thickness. Above some thickness, which depends on the optical aperture desired, the films can be made freestanding. Freestanding films provide a clear aperture free of any supporting substrate.

For example, a 240 nm thick freestanding SWNT film has been demonstrated over a 1 cm$^2$ aperture. Such a film can be supported on a frame containing a hole, which when coated by the transparent nanotube film comprises an optically clear aperture.

Figure 1:
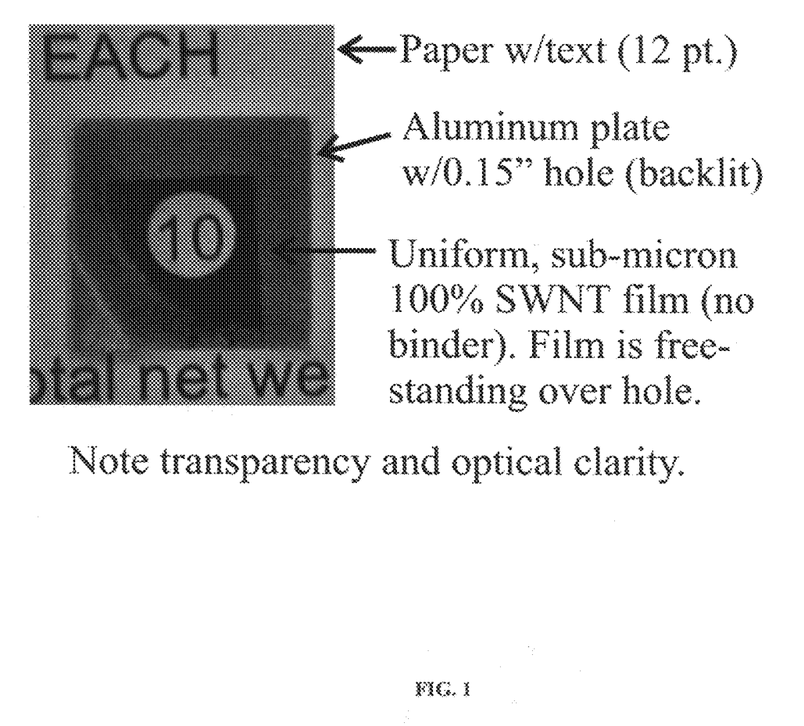
FIG. 1 illustrates a scanned image of a transparent 300 nm thick SWNT film stretched across a hole on an aluminum plate, the film formed according to a preferred method for forming films according to the invention.

FIG. 1 shows a back lit SWNT film according to the invention stretched across a hole on an aluminum plate. The film was produced as described above by vacuum filtering an aqueous SWNT/1 wt % Triton-X-100™ surfactant solution onto a porous mixed cellulose ester membrane. Once the surfactant was washed away using deionized water, the film was dried. The membrane was then clipped to the aluminum plate with the SWNT film contacting the plate. The assembly was subsequently dipped into an acetone bath, dissolving the membrane and transferring the film to the Al plate. The hole in the aluminum plate had a 0.59 cm diameter. The film can be seen to provide a high level of transparency and optical clarity to visible light.

Figure 2:
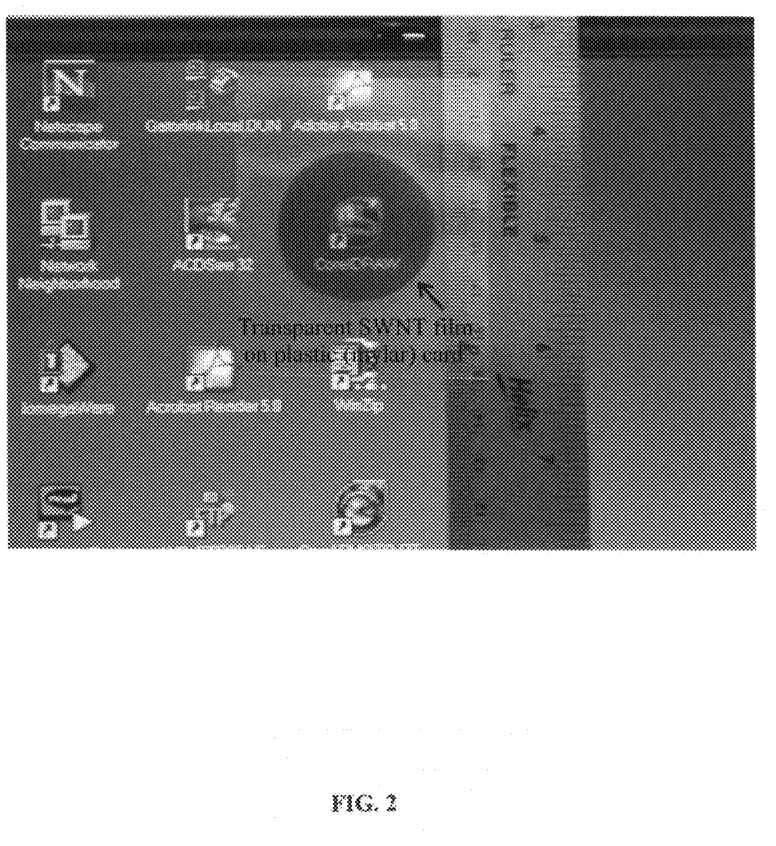
FIG. 2 illustrates the transparency and clarity of a thinner (about 90 nm), but larger diameter film as compared to the film shown in FIG. 1 mounted on a plastic sheet.

FIG. 2 is a scanned image demonstrating the transparency and clarity of a larger diameter, but thinner (~90 nm) SWNT film mounted on a plastic sheet, such as a biaxially-oriented polyethylene terephthalate (boPET) polyester film marketed as MYLAR®. The resistance of a similar film measured on an electrically insulating support (MYLAR®) exhibited a sheet resistance of about 35 ohms/square when acid doped and about 175 ohms/square when de-doped. De-doped films generally provide greater transmittance in the IR as compared to doped films. This is a very high electrical conductivity given the optical transparency, particularly since high levels of optical transmission were found to continue well into the IR portion of the electromagnetic spectrum.

Figure 3:
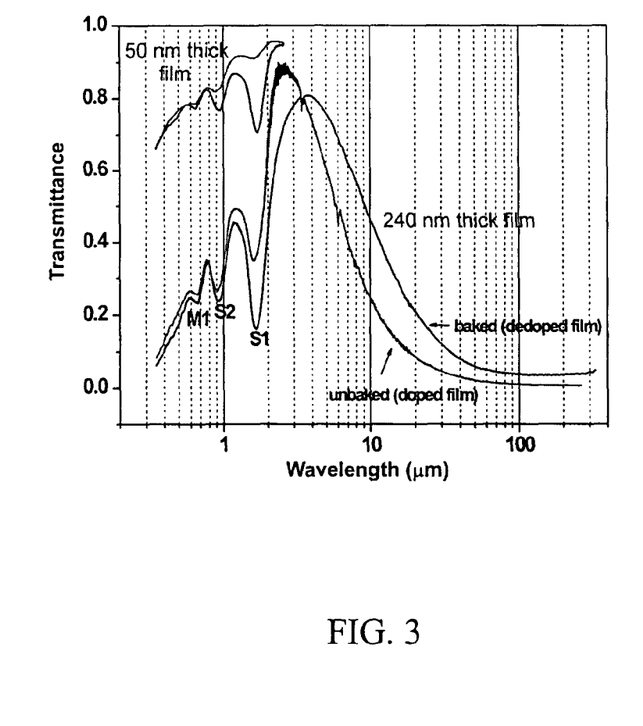
FIG. 3 illustrates the transmission spectrum for a 50 nm SWNT film on a quartz substrate and a 240 nm thick freestanding SWNT film formed according to an embodiment of the invention, for both doped and de-doped films, showing high transmittance throughout the visible and the NIR range. The freestanding, thicker, film allowed recording of the transmittance over the broad spectral range without interfering absorption from a supporting substrate.

FIG. 3 shows the transmission spectrum experimentally obtained for 50 nm and 240 nm thick SWNT films formed according to an embodiment of the invention showing high transmittance in both the visible and the NIR range. For the 50 nm thick film, the surface resistance when acid doped is seen to be about 60 ohms/square and when de-doped by baking to 600° C. in inert gas (gray spectral curve) is about 300 Ohms/square. Significantly, it is noted that the transmittance spectrum for the doped 50 nm thick film is seen to be 70% or greater over the visible spectrum (0.4 to 0.75 microns). The spectral differences shown between the baked and unbaked film arise because nitric acid, which was used in the nanotube purification, charge transfer dopes the nanotubes, while the bake-out desorbs the dopant species, dedoping the nanotubes. Such doping also impacts the electrical conductivity of the films making the electrical conductivity for the doped films more than three times the conductivity of the de-doped films at room temperature.

High transmittance into the IR is useful because the 3-5 micron range is generally free of atmospheric water absorbance and is commonly used for atmospheric transmissions. Although there are a number of optically transparent, electrically conducting oxides materials available which are useful in the visible part of the spectrum, in the IR, the number of available materials retaining good transparency and electrical conductivity diminishes dramatically. Most conducting materials become less transmissive above about 2 μm due to what is generally referred to as "free carrier absorption".

The depth of transparency into the IR is believed to be primarily limited by the free carrier absorption of the metallic nanotubes which make up about ⅓ of the film. Should pure or increasingly semiconducting SWNTs become available, the films can remain optically transparent further into the IR, such as to a wavelength of at least 40 μm as compared to more metallic nanotubes. As noted above, semiconducting films can be made electrically conducting by charge transfer doping, such as bromine or iodine doping.

The absorbance on the short wavelength side of the peak labeled M1 in FIG. 3 is due to many combined interband transitions. A characteristic feature of the nanotubes is a sharp Van Hove (VH) singularity structure in the electronic density of states. The absorbance feature labeled M1 arises due to transitions from the highest occupied valence band VH singularity to the lowest empty conduction band VH singularity for the metallic nanotubes in the sample. The absorbance features labeled S1 and S2 arise due to transitions from the highest valence VH singularity to the lowest conduction VH singularity and the second highest to the second lowest valence-to-conduction band VH singularities for the semiconducting nanotubes in the sample, respectively. The absorption just beginning at a wavelength of about 2.4 μm in the unbaked sample and at a wavelength of about 4 μm in the baked sample is believed to be ascribed to free carriers.

The charge transfer doping by the acid is a hole dopant meaning that electrons are removed from the nanotubes and transferred to the dopant molecules which function as electron acceptors. This depletion of the valence band electrons from the VH singularities results in the smaller absorbance feature seen at S1 in the unbaked (doped) versus the baked (dedoped) spectra shown in FIG. 3. Another consequence is the enhanced free carrier absorption in the IR for the doped relative to the undoped case, arising because of hole carriers injected into the semiconducting nanotubes. This provides evidence that the absorbance seen for wavelengths above 4 microns in the baked (dedoped) sample is largely due to the free carrier absorption in the metallic nanotubes alone. Thus, a SWNT film comprised of only semiconducting nanotubes would be transparent much further into the IR.

Without metallic nanotubes in the SWNT film a loss of electrical conductivity would result. However, as noted above, semiconducting nanotubes can be doped to become more electrically conductive. Thus, for semiconducting SWNT films, electrical conductivity can be enhanced by controlled doping with some accompanying loss of the additional depth of transparency into the IR. Such controlled doping could be effected by exposure of the nanotubes to other air stable hole dopants besides nitric acid, such as vapors of bromine or iodine. Alternatively, if the film is protected from atmospheric water and oxygen, electron donor dopants, such as the alkali metals could be used. Even with SWNT films formed from presently available nanotube sources which include about ⅓ metallic nanotubes, doping provides some measure of control over the transparency and electrical conductivity of the resulting films.

SWNT films produced using the invention can be used for a variety of applications. For example, SWNT films formed using the invention can be used for solar cells, video displays, solid state light sources, receivers, or applications requiring an electrically conductive layer which is also optically transparent.

The SWNT films formed using the invention provide at least two significant advantages over conventional optically transparent electrode materials. First, the SWNT films provide good optical transmission in the 0.4 to 5 μm spectral range as well as high electrical conductivity. Second, the films formed are compatible with many other materials, such as upcoming polymer active layers in a wide variety of devices. A possible additional advantage for some applications is that by obtaining purified SWNTs or adding a purification step, SWNTs essentially free of metal catalyst(s) can be provided for filtration according to the invention, and as a result, resulting films according to the invention can tolerate 450° C. in air or over 1000° C. in inert atmospheres.

Most available optically transparent electrode materials require temperatures greater than 200° C. to fabricate. Because most polymers cannot tolerate such temperatures, the transparent electrodes must be produced separately, for example, on a separate substrate, following which, the active polymer is applied. Using the invention, the nanotube films in contrast, can be disposed directly on these polymer layers.

There are also several applications where the SWNT films can provide significant advantages. One example is in transparent spectrochemical electrodes, where the inertness of the nanotubes may provide added advantages.

Optical modulators may also be formed based on the thin SWNT films produced using the invention. For example, the SWNT film can provide one electrode of a capacitor like device consisting of indium tin oxide (ITO) on glass covered with a thin aluminum oxide layer covered with the thin transparent SWNT film. By applying a voltage between the ITO and SWNT electrodes, the SWNT film charges slightly, thus changing its optical transmittance over a particular absorption band of the SWNT film.

The invention can also be used to form chemical sensors. For example, the optical properties of the SWNT films can change in the presence of halogens or alkali ions, or possibly other species. It may be possible to distinguish the presence of particular species from others through identification of particular resulting optical properties of the SWNT film in the presence of particular species. For example, by monitoring transmission levels through a SWNT film formed using the invention, the presence of certain chemicals can be detected. One advantage of the electrical conductivity of the films in such applications is that by driving sufficient current through them they can be self heated, desorbing the chemical species after it has been detected. Such sensitivity recovery is enhanced by making the film freestanding over the optical aperture allowing efficient self heating at lower current.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. An optically transparent and electrically conductive single walled carbon nanotube (SWNT) film, comprising a plurality of single walled carbon nanotubes (SWNTs), wherein said film has uniform nanotube density across said film's area with said nanotube's surfaces being free of residual stabilizing agents allowing intimate electrical contact between said nanotubes throughout said film, and said film is less than 1,000 nm thick, and wherein at a thickness of 100 nm said film has sufficient interpenetration to provide a 25° C. sheet resistance of less than 200 ohm/sq and at least 20% optical transmission throughout a wavelength range from 0.4 μm to 5 μm.

2. The SWNT film of claim 1, wherein a morphology of said film comprises stacked planes, said SWNTs having random orientation in said planes.

3. The SWNT film of claim 1, wherein said optical transmission is at least 30%.

4. The SWNT film of claim 1, wherein SWNTs include at least one dopant, wherein for said 100 nm thick film said sheet resistance is <50 ohm/square.

5. The SWNT film of claim 4, wherein said dopant is selected from the group consisting of halogens and graphite intercalants.

6. The SWNT film of claim 1, wherein said film consists essentially of said SWNTs, wherein said SWNTs comprise more than 99% by weight of said film.

7. An optically transparent and electrically conductive single walled carbon nanotube (SWNT) film, comprising a plurality of single walled carbon nanotubes (SWNTs), wherein said film has uniform nanotube density across said film's area with said nanotube's surfaces being free of residual stabilizing agents allowing intimate electrical contact between said nanotubes throughout said film, and wherein at a thickness of 50 nm said film provides a 25° C. sheet resistance of ≦60 ohm/square and at least 70% optical transmission throughout a wavelength range from 0.4 μm to 0.75 μm.

8. The SWNT film of claim 7, wherein SWNTs include at least one dopant.

9. The SWNT film of claim 8, wherein said dopant is selected from the group consisting of halogens and graphite intercalants.

10. An optically transparent and electrically conductive single walled carbon nanotube (SWNT) film, comprising a plurality of single walled carbon nanotubes (SWNTs), wherein said film has uniform nanotube density across said film's area with said nanotube's surfaces being free of residual stabilizing agents allowing intimate electrical contact between said nanotubes throughout said film, and said film is less than 1,000 nm thick, and wherein at a thickness of 100 nm said film has sufficient interpenetration to provide a 25° C. sheet resistance of less than 200 ohm/sq and at least 20% optical transmission throughout a wavelength range from 0.4 μm to 5 μm, and wherein said SWNT film is capable of being placed in intimate contact with a second surface wherein said second surface can be viewed through said SWNT film.

\* \* \* \* \*

UNITED STATES PATENT AND TRADEMARK OFFICE
CERTIFICATE OF CORRECTION

PATENT NO.          : 7,776,444 B2
APPLICATION NO.     : 11/583545
DATED               : August 17, 2010
INVENTOR(S)         : Andrew Gabriel Rinzler and Zhihong Chen It is certified that error appears in the above-identified patent and that said Letters Patent is hereby corrected as shown below:

Column 1,
Lines 9-10, "filed on Jul. 18, 2003, now U.S. Pat. No. 7,261,582, which claims" should read --filed on Jul. 18, 2003, now U.S. Pat. No. 7,261,852, which claims--.

Signed and Sealed this
Eleventh Day of January, 2011

David J. Kappos
*Director of the United States Patent and Trademark Office*